United States Patent
Todsen et al.

(10) Patent No.: US 8,873,644 B1
(45) Date of Patent: Oct. 28, 2014

(54) ISOLATED MODULATOR CIRCUIT WITH SYNCHRONIZED PULSE GENERATOR FOR SELF-MONITORING RESET WITH CAPACITIVELY-COUPLED ISOLATION BARRIER

(71) Applicants: Texas Instruments Incorporated, Dallas, TX (US); Texas Instruments Deutschland GmbH, Freising (DE)

(72) Inventors: James Lee Todsen, Tucson, AZ (US); Caspar Petrus Laurentius van Vroonhoven, Munich (DE)

(73) Assignees: Texas Instruments Deutschland GmbH, Freising (DE); Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/954,882

(22) Filed: Jul. 30, 2013

(51) Int. Cl.
*H04B 14/06* (2006.01)
*H03M 7/30* (2006.01)

(52) U.S. Cl.
CPC .................................. *H03M 7/3006* (2013.01)
USPC ........... 375/247; 375/316; 375/354; 375/340; 341/143; 341/155; 341/164; 341/126

(58) Field of Classification Search
CPC ... H03M 1/001; H03M 1/007; H03M 1/0617; H03M 1/06; H03M 1/12; H03M 3/00; H03M 3/02; H03M 3/30; H03M 3/376; H03M 3/39; H03M 3/458; H03M 3/462; H03M 3/478; H03M 3/502; H03M 5/00; H03M 5/02
USPC .......... 375/316, 247, 354, 340; 341/143, 155, 341/164, 126
See application file for complete search history.

(56) References Cited

U.S. PATENT DOCUMENTS

| | | | |
|---|---|---|---|
| 6,509,852 B1 | 1/2003 | Todsen et al. | |
| 6,538,477 B2 | 3/2003 | Leung et al. | |
| 6,765,520 B1 | 7/2004 | Chuang et al. | |
| 7,047,263 B2 | 5/2006 | Todsen et al. | |
| 7,173,340 B2 | 2/2007 | Zhou et al. | |
| 7,741,935 B2 | 6/2010 | Chow et al. | |

OTHER PUBLICATIONS

"200MHz, Second-Order, Isolated Delta-Sigma Modulator for Current-Shunt Measurement", Productuion Date, Texas Instruments, AMC1204, AMC1204B, Apr. 2011 (Revised Aug. 2012) (Addendum Apr. 11, 2013), 33 pages.

*Primary Examiner* — Siu Lee
(74) *Attorney, Agent, or Firm* — Alan A. R. Cooper; Frederick J. Telecky, Jr.

(57) ABSTRACT

Self-monitoring reset circuitry is presented for use in analog-to-digital converters and other modulator circuitry with capacitively coupled isolation barriers in which the modulator output data is monitored for inactivity by a reset circuit synchronized to the modulator clock, and extra pulses are selectively introduced into the data prior to transmission across the isolation barrier if no modulator state changes occur within a predetermined number of clock cycles to provide a predictable data output value for each end of the analog input range and to reset the output to the correct state in situations where transient noise toggles the output and the modulator output is static.

20 Claims, 6 Drawing Sheets

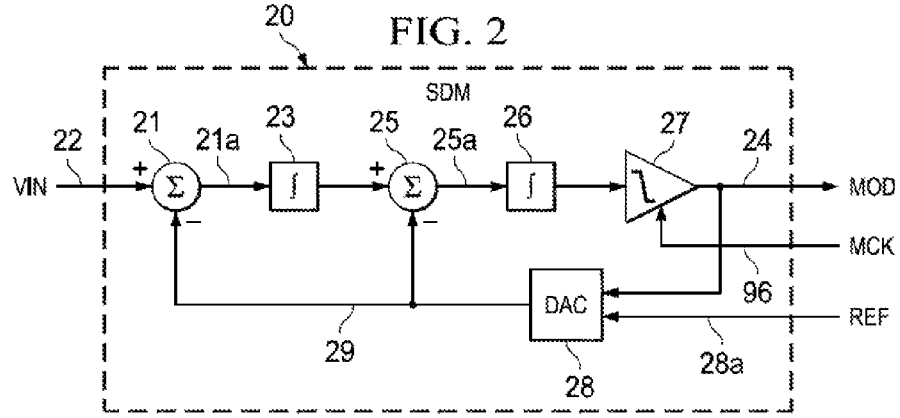
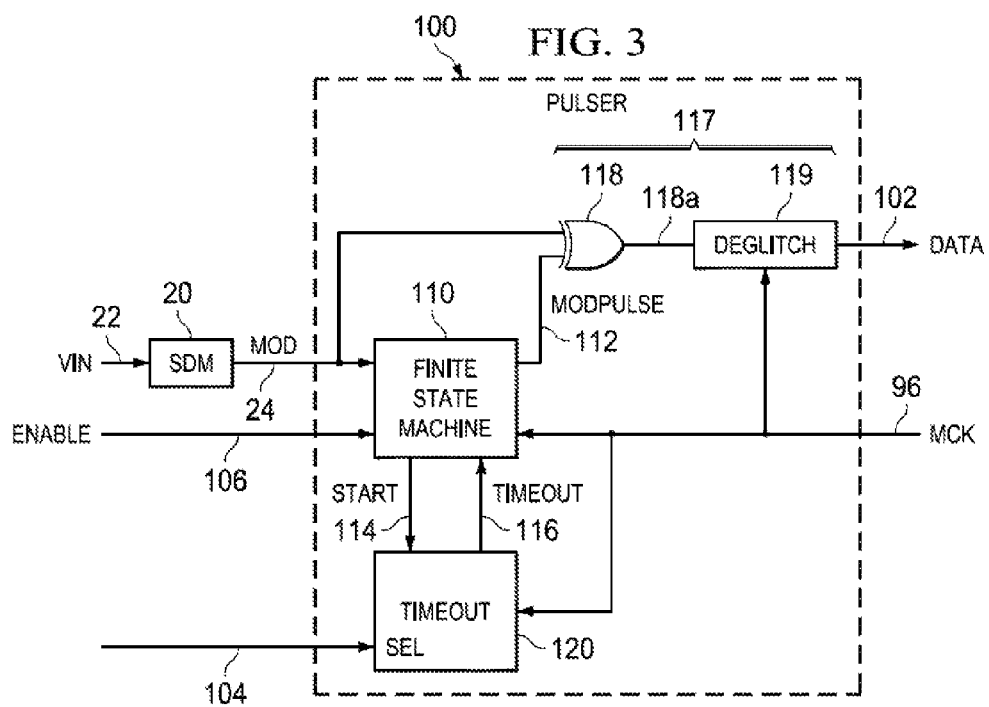

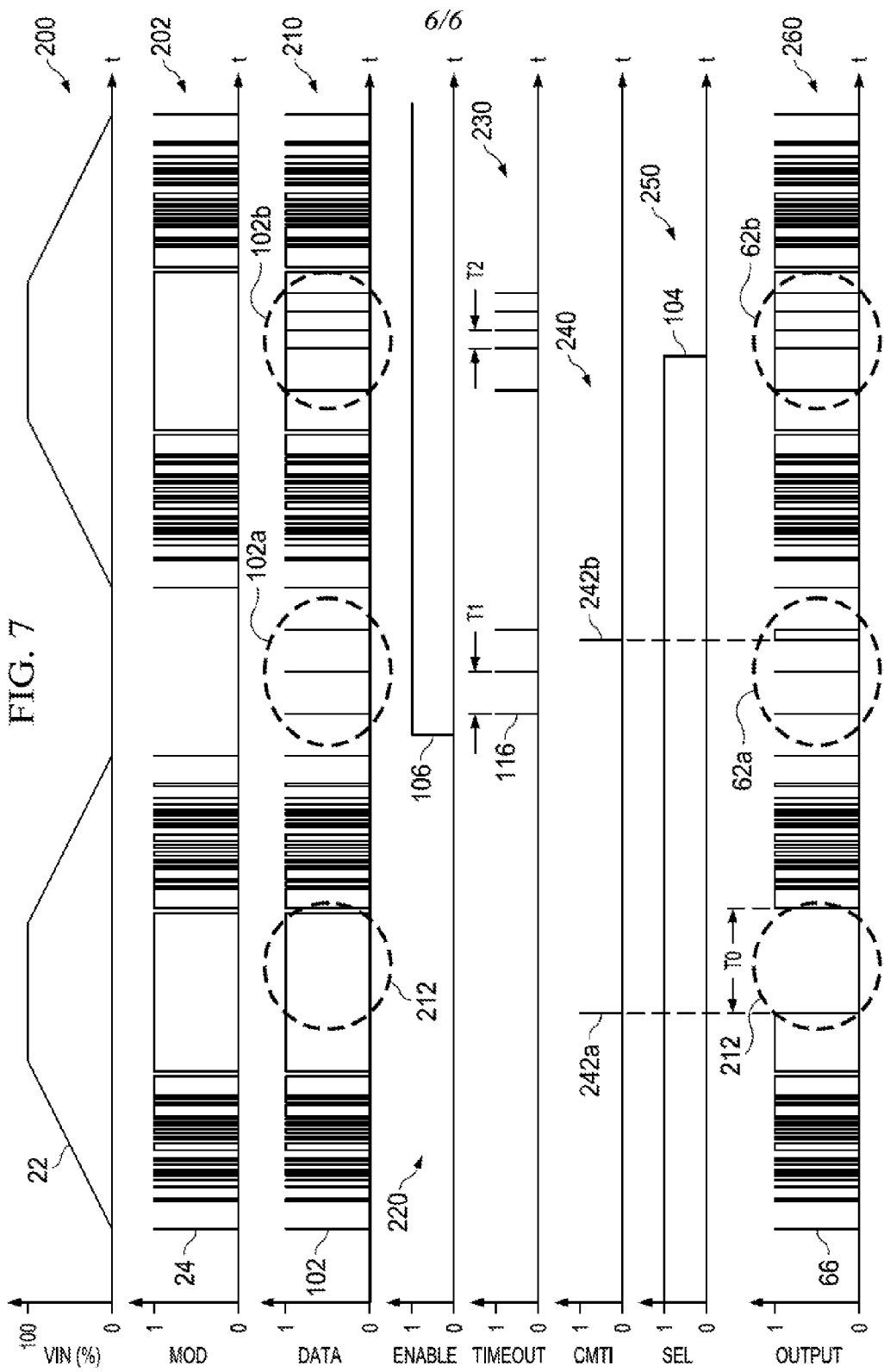

ISOLATED MODULATOR CIRCUIT WITH SYNCHRONIZED PULSE GENERATOR FOR SELF-MONITORING RESET WITH CAPACITIVELY-COUPLED ISOLATION BARRIER

FIELD OF THE INVENTION

The present disclosure relates to modulator circuitry, and more particularly to self-monitoring reset pulse generation circuitry synchronized to a modulator clock for selectively introducing pulses into a modulator output stream.

BACKGROUND

Modulator circuits are used in a variety of data conversion and other applications, in which an analog input signal is to be converted into digital form. One popular form of modulator-based analog to digital converter is known as a Sigma-Delta modulator (SDM, also alternatively referred to as a Delta-Sigma modulator or DSM). In a typical analog-to-digital conversion application, the modulator provides a single-bit data output signal, which is then filtered using a low pass filter to provide a high-resolution digital output, where the filter is known as a decimation filter. In practice, some analog-to-digital conversion applications involve sensing an analog signal that may be at a very high voltage potential relative to the digital system consuming the converted data values. For instance, measurement of the voltage across a current shunt may be used for providing current feedback signals in a control system, where the shunt circuit forms part of a controlled system operating at high voltages. The digital feedback value, on the other hand, may be consumed or used by a microprocessor or other low-voltage circuit, and it is desirable to maintain galvanic isolation between the high and low voltage systems. Accordingly, many current shunt analog-to-digital converters provide the modulator output signal through a capacitively-coupled isolation barrier for subsequent filtering. In operation, the analog input to the modulator circuit is typically an analog voltage signal, and the modulator operates according to a reference voltage. When the input signal is at a top or bottom end of the designed input range, the modulator will output either a series of all one binary value (e.g., logic 1) or the other possible value (0), and the resulting filtered output provides a digital value corresponding to the high or low end of the converter range. However, the receiver circuit on the low-voltage side of the isolation barrier may be subjected to common mode transients, causing the data state of the signal provided to the output filter to toggle even though the actual modulator output is not changing and the analog input voltage has not changed. Accordingly, the subsequent decimation filtering will yield a digital value that appears to change from one end of the conversion range to the other. Accordingly, there is a need for improved data converters and other modulator circuitry to facilitate correct operation in the presence of common mode transients and other noise sources.

SUMMARY

The present disclosure provides isolated modulator circuitry and data converters, as well as techniques for converting analog signals to digital form, in which a reset circuit monitors inactivity in the modulator output data and selectively toggles or adds synchronized pulses to the data if the modulator output does not change within a predetermined number of modulator clock cycles. The concepts of the disclosure find particular utility in situations where the modulator analog input is at one of two ends of the designed conversion range and hence the single bit modulator output is expected to remain at a corresponding one of two binary states, but the signal path from the modulator output through capacitively-coupled isolation circuitry for output to a decimation filter may be subjected to noise such as common mode transients. In this situation, the reset circuit provides a pulse generation function to periodically insert a pulse into the modulator output data stream if the modulator does not change output state for a predetermined number of modulator clock cycles. The introduction of such additional pulses advantageously resets the transmission and receiver circuitry bounding the isolation barrier so that any spurious noise events that may have caused the receiver circuitry to toggle will be corrected within a certain number of clock cycles. Consequently, decimation filtering of the resulting modified output signal will present a repeatable, predictable data value indicating to an end-user or host system that the analog input provided to the modulator is at one of two extremes of the conversion range, while preventing or mitigating the likelihood that the filtered data will falsely indicate a value inconsistent with the true state of the analog input. Moreover, since the injected pulse circuitry is synchronized with the modulator clock, the overall data converter in these situations provides a repeatable digital value that should never ideally reach the absolute minimal or maximal values (e.g., all 0's or all 1's), and the systems and techniques of the present disclosure advantageously facilitate identification of loss of clock or other circuit malfunctions when the data conversion system provides the absolute minimal or maximal value as an output. As a result, an end-user or host system is assured that output data indicating one of two highly repeatable digital values accurately represent situations in which the analog input voltage is at a corresponding one of two extremes of the conversion range, and output values that actually reach the absolute minimal or maximal values can be used to detect operational problems. Moreover, in typical analog-to-digital converter applications in which a user range is designed to not include the absolute minimal or maximal values, the introduction of one or more added pulses or pulse edges into the data stream does not adversely affect the converter accuracy within the user range of operation.

Isolated modulator circuitry and analog to digital converters are provided, having a modulator that provides an output signal according to a received analog input and a modulator clock signal, as well as a pulse generator or reset circuit which receives the modulator output and provides a data output signal including pulses from the modulator output as well as one or more additional pulse edges in response to lack of state changes in the modulator output for a predetermined number of modulator clock cycles. An isolation circuit is provided to convey the data output signal from the reset circuit through a capacitively-coupled isolation barrier to provide a pulse output signal. The reset or pulse generator circuit in certain embodiments includes a finite state machine circuit that provides a start signal synchronized to the modulator clock in response to each state transition of the modulator output. In addition, the finite state machine circuit selectively provides a state machine output signal in response to receipt of a timeout signal. A timeout circuit is provided in certain embodiments which counts the number of modulator clock cycles that occur following receipt of the start signal from the state machine, and provides the timeout signal in response to the number of clock cycles reaching the predetermined number after the most recent start signal. In addition, the reset or pulse generation circuit in certain embodiments includes an exclusive OR logic circuit with a first input receiving the modulator output signal, a second input receiving the state machine output signal, and an output that provides the data output signal when one but not both of the first and second inputs are at a first state. In this manner, the reset or pulse generator circuit can selectively insert one or more added pulses into the output data when the output of the modulator has not changed for the predetermined number of clock cycles, and otherwise maintain normal operation according to a changing (modulating) modulator output data stream.

DESCRIPTION OF THE VIEWS OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which:

FIG. 2 is a schematic diagram illustrating further details of the an exemplary second order modulator in the circuit of FIG. 1;

FIG. 3 is a schematic diagram illustrating an exemplary pulse generator or reset circuit in the integrated circuit of FIG. 1;

FIG. 7 is a waveform diagram showing various signals and waveforms in the integrated circuit of FIGS. 1 and 3.

DETAILED DESCRIPTION

Figure 1:
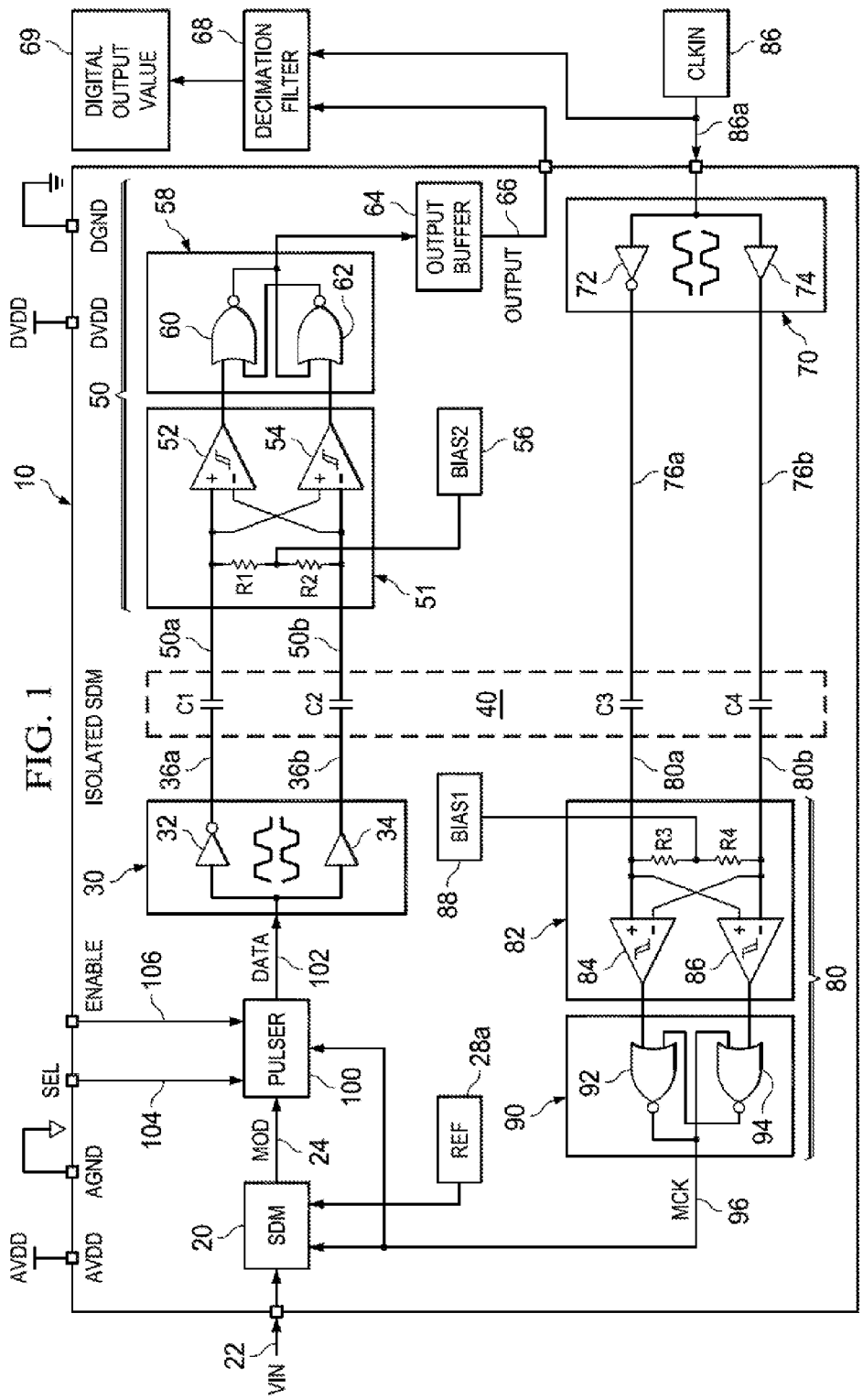
FIG. 1 is a schematic diagram illustrating an exemplary isolated Sigma Delta modulator integrated circuit with a pulse generator to selectively add pulses to the modulator output data in response to inactivity in the modulator output for a predetermined number of modulator clock cycles.

One or more embodiments or implementations are hereinafter described in conjunction with the drawings, wherein like reference numerals are used to refer to like elements throughout, and wherein the various features are not necessarily drawn to scale. The present disclosure provides isolated modulator circuitry with self-monitoring reset circuitry to selectively add pulses or pulse edges into the output stream provided by a modulator. The circuitry and techniques of the present disclosure may be used in a variety of applications, and are illustrated and described in the context of analog to digital conversion, although the various concepts of present disclosure are not limited to the illustrated embodiments or applications.

FIG. 1 illustrates an exemplary isolated Sigma Delta modulator integrated circuit device 10, which includes a modulator 20, in one example a Sigma Delta modulator (SDM), receiving an analog input voltage 22 (VIN) and providing a modulator output 24 (MOD) to a pulse generation or reset circuit 100 (indicated as PULSER circuit 100 in the figure). The pulser 100 operates to provide a data output signal 102 (DATA) based on the modulator output 24 through isolation circuitry 30, 40 and 50 in a forward data path of the integrated circuit 10, including a transmitter circuit 30, an isolation barrier circuit 40 and an output or receiver circuit 50 to provide a pulse output signal 66 (OUTPUT) to a decimation filter circuit 68, which may be separate from or included within the integrated circuit 10 in various implementations. The integrated circuit 10 receives a clock input signal 86a from a clock source 86 (CLKIN) which may likewise be external or internal to the circuit 10. The integrated circuit 10 further includes a differential transmitter 70 for conveying the clock signal through the isolation barrier 40 to a clock receiver circuit 80 which provides a modulator clock signal 96 to the modulator 20 as well as to the pulser 100. As shown in FIG. 1, the illustrated circuit 10 provides the isolation barrier 40 in the form of a dual path capacitively-coupled circuit for conveying differential signals between a high voltage side (on left in FIG. 1) operated according to an analog supply voltage AVDD with an associated analog ground input AGND, and a low voltage or digital side (on the right in FIG. 1) operated according to a digital supply voltage DVDD (e.g., 3 V or 5 V) with an associated digital ground DGND.

The pulser circuit 100 in the illustrated embodiment receives a select input signal 104 and an enable signal 106 from an external or host system (not shown), and provides a single ended data output signal 102 to the data transmitter circuit 30. The transmitter 30 in this example includes an inverter 32 and a buffer 34 (non-inverting) receiving the data signal 102 and providing a differential transmit output signal at first and second transmit outputs 36a and 36b which are connected to first ends or terminals of capacitors C1 and C2 of the isolation barrier circuit 40. The other ends of the capacitors C1 and C2 are respectively coupled to first and second receiver inputs 50a and 50b of the receiver circuit 50. The receiver circuit 50 includes a circuit 51 having resistors R1 and R2 connected between the input lines 50a and 50b with a bias voltage 56 (BIAS2, e.g., 2.5 V in one example) being connected to a center node joining R1 and R2 as shown. The receiver input lines 50a and 50b are connected to hysteresis comparators 52 and 54 in a cross-coupled fashion as shown whose outputs are provided to a circuit 58 including NOR gates 60 and 62 to provide a single ended digital output to an optional output buffer 64 which provides the pulse output signal 66 for use by the decimation filter 68. In a typical analog to digital conversion application, the decimation filter 68 may be a sinc filter that converts the pulse output 66 to a digital output value 69 representing the amplitude of the converted analog input signal 22, for example, by counting the number of pulses in the pulse output signal 66 over a predetermined time period that is greater than the cycle time of the modulator clock signal 96. The decimation filter 68, and this regard, is also operated according to (synchronized with) the clock input signal 86a.

As seen in FIG. 1, moreover, the circuit 10 also includes an isolation path for the clock input signal 86a, which is provided as a single ended input to a clock transmitter circuit 70 having an inverter 72 and a non-inverting buffer 74 to provide a differential clock transmit output signal at first and second transmit outputs 76a and 76b. The outputs 76a and 76b are capacitively coupled via isolation circuit capacitors C3 and C4 with first and second clock receiver input lines 80a and 80b on the high voltage side of the integrated circuit 10 as shown. The high voltage side of the circuit 10 further includes a clock receiver circuit 80 with a circuit 82 having resistors R3 and R4 individually connected between another bias voltage 88 (BIAS1 (e.g., 2.5 V)) and a corresponding one of the receiver input lines 80a and 80b to provide voltages as inputs to comparators 84 and 86 of a circuit 82. The comparators 84 and 86, in turn, provide output signals to NOR gates 92 and 94 of a receiver output circuit 90 which provides the modulator clock signal 96 to the modulator 20 and the pulser 100.

Referring also to FIG. 2, the modulator circuit 20 in one example is a second-order Sigma Delta modulator receiving the analog input 22 and a first summing junction 21 which subtracts an analog feedback signal 29 provided by a feedback digital to analog converter 28 (DAC) to provide an error signal 21a as an input to a first integrator circuit 23. The integrator 23 provides an output to a second summing junction 25 which subtracts the analog feedback signal 29 to provide a second error signal 25a to a second integrator 26. The second integrator 26 integrates the second error signal 25a to provide an output to a comparator 27. The comparator 27 compares the second integrator output to a fixed voltage (typically ground or 0V in a single-ended implementation as shown in FIG. 2, in a differential implementation not shown the positive and negative outputs of the second integrator output are compared against each other) and updates the modulator output signal 24 at each cycle of the modulator clock 96. The digital to analog converter 28 converts the modulator output signal 24 to provide the analog feedback signal 29 based on a reference voltage 28a (REF1) for subtraction from the input signal 22 and from the first integrator output via the summing junctions 21 and 25, respectively. When the value of the second integrator output signal crosses the fixed voltage, the comparator 27 switches the modulator output signal 24 from low to high or high to low depending on its previous state, whereby the modulator output 24 is a single bit pulse output stream updated at each cycle of the clock 96. The converted analog feedback signal 29 also responds at the clock pulse to modify the error signals 21a and 25a to thereby cause the integrators 23 and 26 to progress in the opposite direction and to force the output of the second integrator 26 to track the average of the analog input voltage 22. As a result, the modulator output signal 24 is a series of pulses during operation with the input voltage 22 within a designed conversion range. Although illustrated as employing a second-order Sigma Delta modulator 20, the concepts of the present disclosure may be employed in isolated integrated circuits and modulator circuitry employing any suitable form of modulator circuit 20.

Referring also to FIG. 1, however, when the received analog input voltage 22 is overloaded, either high or low, the modulator output signal 24 will be either all binary 1's or all 0's. Directly providing the modulator output signal 24 to the isolation circuit transmitter 30 and then the receiver output stage 50 for use by the decimation filter 68 would normally result in the filter 68 receiving all binary 1's or all 0's when the input voltage 22 is at the high or low extreme end of the input range. However, the isolation receiver circuit 51 (FIG. 1) may be susceptible to common mode transient events, causing the outputs of the comparators 52 and 54 to toggle unexpectedly. As a result, for a static input voltage 22 at one of the maximum or minimum values, the receiver output circuitry 58 and the output buffer 64 may then potentially provide the opposite value in the pulse signal 66 to the decimation filter 68. In this case, a host system or end-user viewing the resulting digital value from the decimation filter 68 would perhaps believe the input voltage 22 was at the lower extreme, when in fact it was at the high extreme or vice versa.

Referring now to FIGS. 1 and 3-6, in order to address this problem, the present disclosure provides the pulser circuit 100 (alternatively referred to in as a pulse generator circuit or a reset circuit) disposed in the forward data path of the circuit 10 between the output of the modulator 20 and the isolation circuit transmitter 30. In operation, the pulser 100 provides a self-monitoring reset function to generate the data output signal 102 provided to the transmitter 30 including pulses from the modulator output signal 24 and at least one additional pulse or pulse edge 102a (FIG. 7 below) in response to inactivity or lack of state changes in the modulator output signal 24 for a predetermined number of clock cycles of the modulator clock signal 96 (i.e. a predetermined number of the cycles of the received clock input signal 86a). As seen in FIGS. 1 and 3, the pulse circuit 100 is also synchronized to the modulator clock signal 96, and can be constructed using any suitable circuitry, programmable or fixed, by which one or more pulses are introduced into the data output signal 102 in addition to those received in the original modulator output signal 24 based on a determination that a predetermined number of clock cycles have elapsed with no activity in the modulator output signal 24.

FIG. 3 illustrates one exemplary pulse generator or reset circuit 100 in accordance with various aspects of the present disclosure. The circuit 100 includes a finite state machine circuit 110, a timeout circuit 120 and a logic circuit 117, each of which is synchronized with the modulator clock signal 96. The finite state machine circuit 110 in this embodiment provides a start signal 114 (START) in response to each state transition of the modulator output signal 24, and also provides a state machine output signal 112 (MODPULSE) in response to receipt of a timeout signal 116 (TIMEOUT) from the timeout circuit 120. The timeout circuit 120 counts the number of clock cycles of the modulator clock signal 96 after receiving the start signal 114, and is configured with a fixed or selectable predetermined number of clock cycles. In operation, the timeout circuit 120 selectively provides the timeout signal 116 to the finite state machine 110 when the number of modulator clock cycles since the most recent start signal 114 reaches the predetermined number. In this manner, the finite state machine 110 receives the timeout signal 116 only when the modulator output signal 124 has been inactive (no output state changes) for the predetermined number of modulator clocks. Accordingly, the finite state machine circuit 110 asserts the state machine output signal 112 when this period of inactivity has been detected.

As seen in FIG. 3, moreover, the logic circuit 117 includes an exclusive OR (XOR) gate 118 that receives the modulator output signal 24 and the state machine output signal 112 as inputs, and provides a gate output signal 118a having a first state (e.g., 1) when one but not both of the inputs are at a first state (e.g., 1). The gate output signal 118a is provided as an input to an optional deglitch circuit 119, which can be implemented using any suitable circuitry, and which provides the data output signal 102 accordingly. In this manner, the data output from the pulse generator circuit 100 is based at least in part on the modulator output signal 24 and the state machine output signal 112, and includes pulses from the modulator output signal 24 and any additional pulse edges introduced by the finite state machine circuit 110 due to a predetermined amount of inactivity in the modulator output signal 24. Moreover, the data output signal 102 is synchronized to the modulator clock signal 96, and therefore subsequent decimation filtering of the pulses in the output data signal 102 will provide a repeatable, predictable digital value in cases where the modulator output signal 24 is inactive (one repeatable value for a modulator output including all 1's and another repeatable value for the modulator output signal 24 including all 0's).

This operation advantageously resets or re-triggers the isolation transmitter circuit 30 (FIG. 1) by introduction of an additional pulse in the data output 102, to essentially undo any undesired toggling in the isolation receiver circuit 50 that may be caused by common mode transients or other spurious noise events while the modulator output signal 24 is inactive. In addition, since the finite state machine 110 and timeout circuit 120 operate according to the modulator clock signal 96, conversion of the data output signal 102 by a host system (e.g., via decimation filter 68 and FIG. 1) in the case of an inactive modulator output signal 24 will yield one of two possible repeatable digital values, which will not be the absolute maximal or minimal numbers. Therefore, a host system upon receiving the absolute maximal or minimal values may infer that one or more problems exist in the analog to digital conversion system, such as loss of clock signal, etc. The present disclosure therefore advantageously allows diagnostic monitoring through the normal data output 66 of the circuitry 10, and also mitigates or eliminates the possibility of the host system receiving an incorrect data value when noise events occur while the modulator output signal 24 is inactive.

Figure 4:
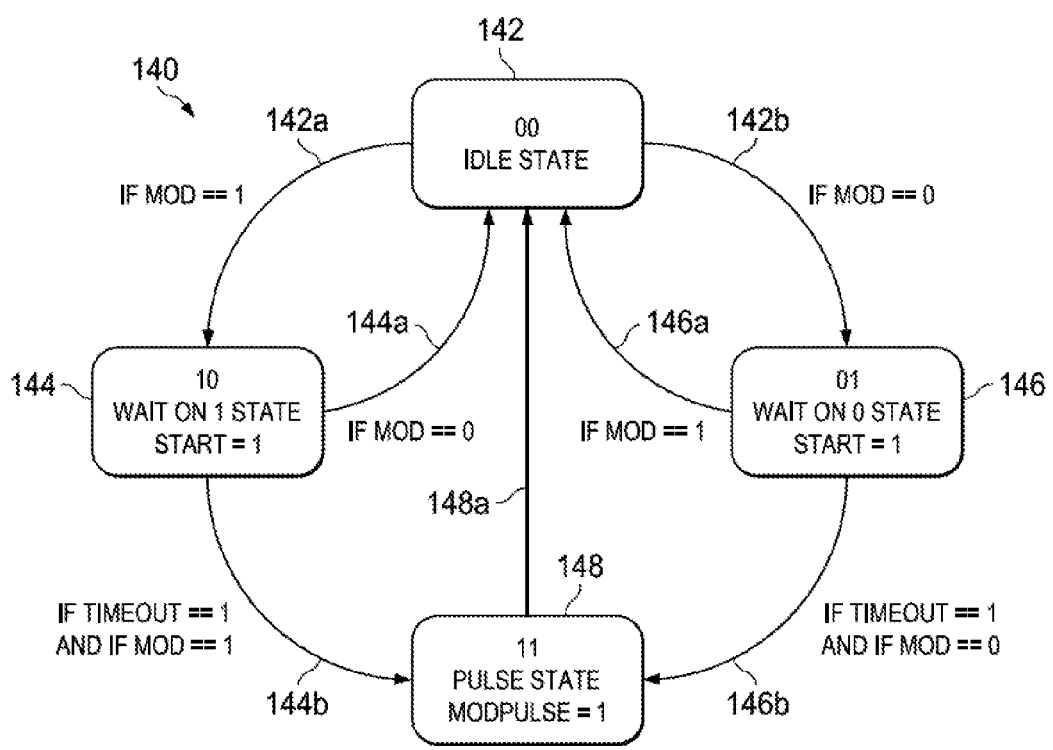
FIG. 4 is a state diagram illustrating operation of a finite state machine in the pulse generation or reset circuit of FIGS. 1 and 3.
Figure 5:
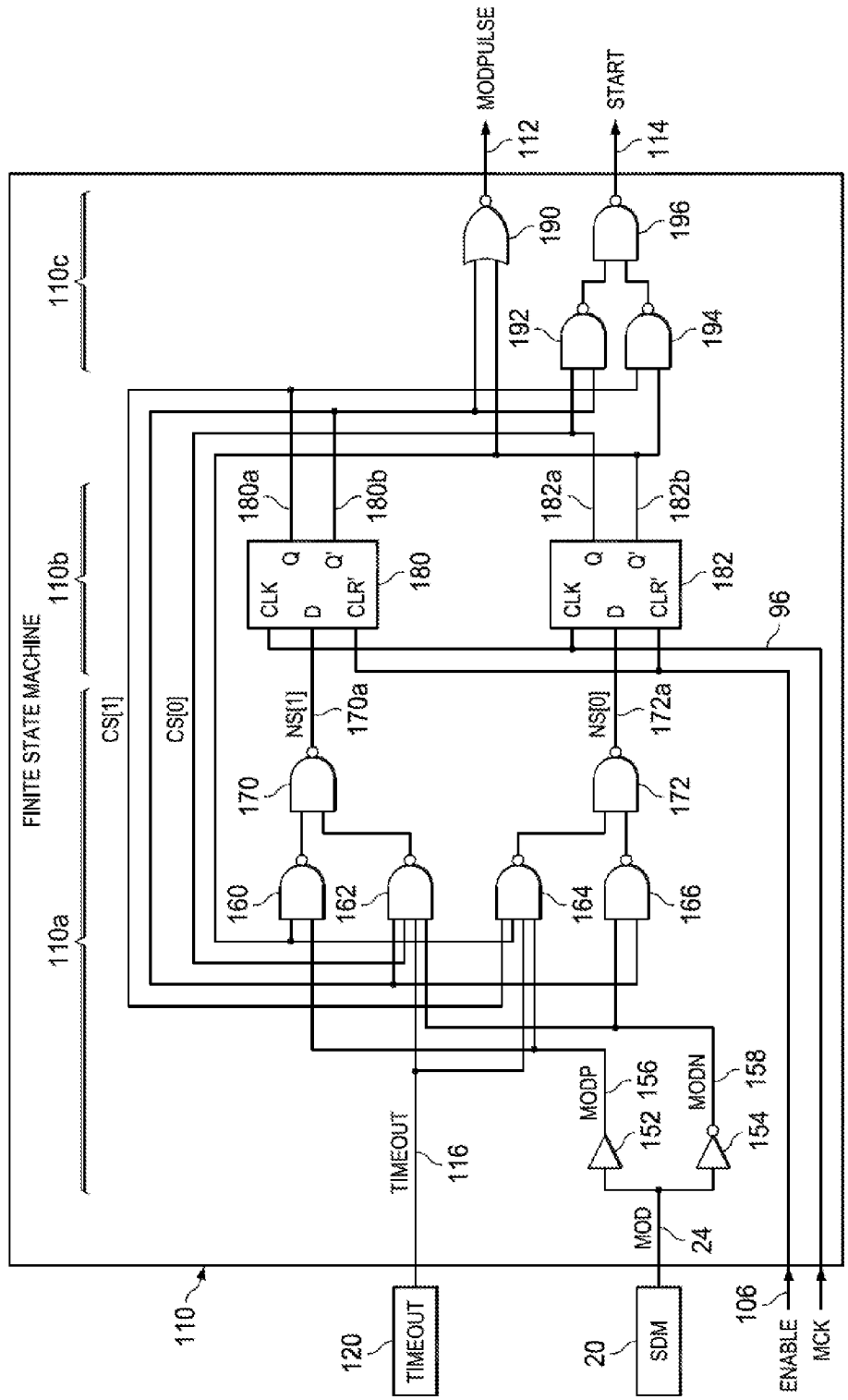
FIG. 5 is a schematic diagram illustrating an exemplary finite state machine circuit in the pulse generator of FIGS. 1 and 3.

Referring also to FIGS. 4 and 5, a state diagram 140 as provided in FIG. 4 illustrating operation of the finite state machine circuit 110, and FIG. 5 shows a detailed circuit implementation of one embodiment of the finite state machine 110. As seen in FIG. 4, the state machine 110 operates in a first state 142 (binary "00") according to the current state of the modulator output signal 24 (MOD) after generation of an additional pulse by the finite state machine 110 in response to receipt of the timeout signal 116. Upon the next modulator clock signal 96, if the modulator output data 24 is a binary "1", the state machine 110 transitions along path 142a to state 144 (binary state "10") and asserts the start output signal 114 to cause the timeout circuit 120 to begin counting modulator clock cycles. Otherwise, the state machine 110 transitions from the state 142 along path 142b to state 146 (binary "01") if the modulator output data 24 is a binary "0", and provides the start signal 114 to the timeout circuit 120. At the state 144, the state machine 110 detects the modulator output data 24 at the next modulator clock 96, and if the data is a "0", transitions along path 144a back to state 142, thereby indicating activity (state change) in the modulator output data 24. Similarly, from state 146, the state machine 110 monitors the next modulator data output that, and if it is a "1", transitions along path 146a back to the original state 142, since the modulator output data 24 includes a state change (e.g., a "0" followed by a "1").

During normal operation with the modulator 20 actively changing states (e.g., for conversion of analog input signals 22 in a normal range of operation), the state machine circuit 110 transitions between states 142, 144 and 146 as described above according to the specific bit pattern in the modulator output data 24. At state 144 or 146, however, if no change in the data is detected (e.g., a subsequent binary "1" is received at state 144 or a subsequent "0" is received at state 146), the finite state machine does not change state until the timeout signal 116 is received from the timeout circuit 120, thus indicating that a predetermined number of modulator clock cycles have occurred since the most recent assertion of the start signal 114. In such a case, the state machine transitions from state 144 along path 144b (indicating a modulator output data stream 24 including all binary 1's for the predetermined number of clock cycles) or transitions from state 146 along path 146b (indicating modulator output data 24 including all 0's for the predetermined number of clocks) to state 148 (binary "11"). At state 148, the state machine circuit 110 asserts the state machine output 112 (MODPULSE) in response to receipt of the timeout signal 116. As noted above, assertion of the state machine output signal 112 (e.g., active high or "1" in this example) causes the logic circuit 117 (FIG. 3) to introduce an additional pulse edge into the exclusive OR gate output signal 118a, thereby providing at least one additional pulse edge in the data output signal 102.

FIG. 5 illustrates one exemplary circuit implementation of the state machine 110 operative according to the state diagram 140 of FIG. 4. It will be appreciated that the circuit 110 in FIG. 5 is but one example, and other logic circuits may be constructed to implement a finite state machine circuit that provides a start signal 114 in response to state transitions of the modulator output signal 24 and provides a state machine output signal 112 in response to receipt of a timeout signal 116 from the timeout circuit 120. As seen in FIG. 5, the illustrated state machine circuit 110 includes a first logic circuit 110a which receives the modulator output signal 24 from the modulator 20, and provides a set of inverse (positive and negative) modulator pulse signals 156 (MODP) and 158 (MODN) via a non-inverting buffer 152 and an inverter 154. The first logic circuit 110a also receives the timeout signal 116 from the timeout circuit 120, as well as current state digital signals 180a, 180b, 182a and 182b representing a binary encoding of a current state (CS) of the finite state machine circuit 110. The logic circuit 110a includes four NAND gates 160, 162, 164 and 166 receiving the current state signals 180a, 180b, 182a and 182b, the timeout signal 116 and the positive and negative modulator data signals 156 and 158, and providing outputs to a pair of next state output NAND gates 170 and 172 which provide next state digital signals 170a and 172a respectively representing a binary encoding of a next state (NS) of the finite state machine circuit 110. In this implementation, moreover, the current state signal 180a represents a most significant bit (MSB) of the current state (CS[1] in FIG. 5) and the signal 182a represents the least significant bit (LSB) of the current state (CS[0]), where these two bits correspond to the binary encoding of the state diagram states 142, 144, 146 and 148 in FIG. 4 above. Moreover, the next state signal 170a corresponds to a most significant bit of the next state machine state (NS[1]) and the signal 172a corresponds to the least significant bit of the next state (NS[0]).

As seen in FIG. 5, the illustrated finite state machine circuit 110 further includes a flip-flop circuit 110b with first and second D-type flip-flops 180 and 182 with clock inputs (CLK) receiving the modulator clock signal 96. In addition, the finite state machine 110 in this example also includes an enable input receiving and enable signal 106 (e.g., from a host system, not shown), with the flip-flops 180 and 182 having active low clear inputs (CLR') connected to receive the enable signal 106, thereby allowing the pulse injection aspects of the present disclosure to be selectively enabled or disabled by an end-user or host system in certain embodiments. In addition, the data (D) inputs of the flip-flops 180 and 182 are connected to receive the next state digital signals 170a and 172a, respectively, from the NAND gates 170 and 172. The flip-flop circuit 110b thus effectively provides a one clock cycle delay to set the current state of the state machine 110 according to the modulator clock signal 96 and provides the current state digital signals 180a, 180b, 182a and 182b as inputs to the first logic circuit 110a as well as to an output logic circuit 110c.

The output logic circuit 110c in FIG. 5 includes NAND gates 192, 194 and 196 to provide the start signal 114 (START) to the timeout circuit 120 in response to each state transition of the current state CS of the finite state machine 110 represented by the current state digital signals 180a, 180b, 182a and 182b. In addition, the output logic circuit 110c includes a NOR gate 190 receiving the inverted output signals 180b and 182b from the flip-flops 180 and 182, respectively, where the output of the NOR gate 190 provides the state machine output signal 112 (MODPULSE) to the exclusive OR gate 118 in FIG. 3 for selective introduction of one or more additional pulse edges into the output data 102 as described above.

Figure 6:
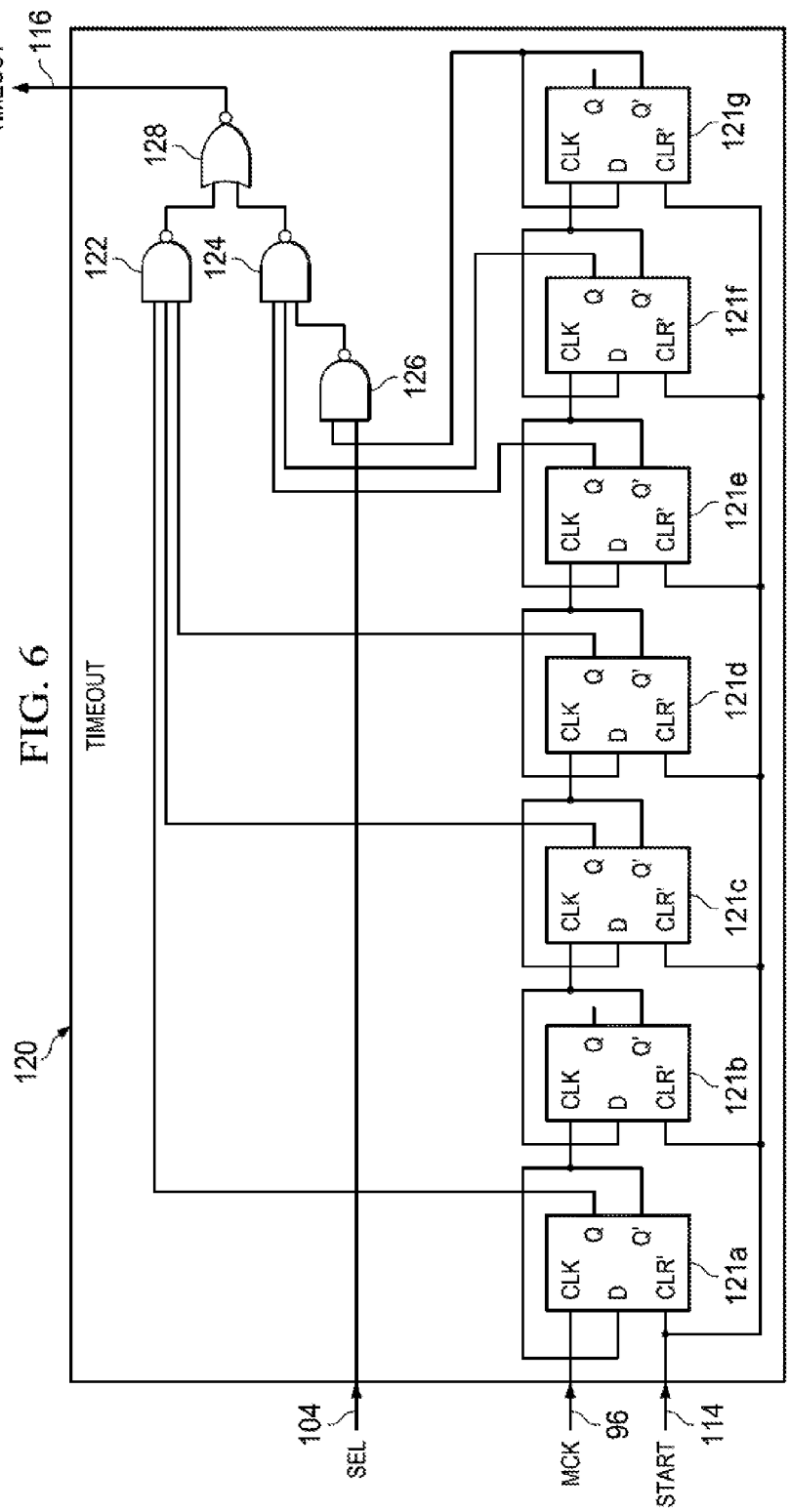
FIG. 6 is a schematic diagram illustrating an exemplary programmable timeout circuit used to count a predetermined number of modulator clock cycles in the pulse generation or reset circuit of FIGS. 1 and 3.

Referring also to FIG. 6, an exemplary circuit implementation of the timeout circuit 120 is illustrated, including D-type flip-flops 121a, 121b, 121c, 121d, 121e, 121f and 121g connected to one another in a string to provide a clock counter circuit. Each of the flip-flops 121a-121g has an active low clear (CLR') input connected to the start signal 114 from the finite state machine circuit 110, whereby each assertion of the start signal 114 restarts the resulting clock counter. In addition, the first flip-flop 121a has a clock input (CLK) connected to receive the modulator clock signal 96, with the inverse output (Q') of each flip-flop being connected to the clock input (CLK) of the next or subsequent flip-flop as shown, and the data input (D) of each flip-flop 121a-121g is connected to its own inverse output (Q').

A logic circuit is formed by NAND gates 122, 124 and 126 and a NOR gate 128 to provide the timeout signal 116 to the finite state machine circuit 110 when the clock counter circuitry 121a-121g has reached a predetermined number of modulator clock cycles. In particular, the data (Q) outputs of certain of the flip-flops 121a-121f are connected as inputs to the logic circuitry 122, 124 and 126 to define the predetermined number of clock cycles at which the timeout signal 116 will be provided (asserted as an active high state "1" in one example). In addition, the illustrated timeout circuit embodiment 120 of FIG. 6 receives a configuration input signal 104 (SEL) connected as an input to the NAND gate 126 to selectively include the output of the final flip-flop 121g or exclude this output from the clock cycle counting by the gates 122, 124 and 128. In this example, the connection of various data outputs from the flip-flops 121a-121g to the logic circuitry provides for a timeout signal 116 being provided at either 61 or 125 clock cycles following the most recent start signal 114. In this regard, the illustrated finite state machine implementation 110 of FIGS. 3 and 5 takes three clock cycles, whereby the selective operation of the timeout circuit 120 in FIG. 6 to provide an additional 61 or 125 clock cycle delay provides an overall predetermined number of either 64 or 128 cycles of the modulator clock signal 96, after which the finite state machine 110 responds by providing the state machine output signal 112 (MODPULSE) for introduction of an additional pulse or pulse edge into the data output 102.

FIG. 7 illustrates graphs 200, 202, 210, 220, 230, 240, 250 and 260 showing various signals and waveforms in the circuit 10 during operation. The graph 200 in FIG. 7 illustrates an exemplary analog input voltage scenario in which the analog input signal 22 (VIN) is initially at the low value (0% of a defined input span), and thereafter ramps up to the maximal value (100%), remains at 100% for a certain amount of time, and thereafter ramps back down to 0%. In the illustrated example, moreover, this input signal pattern repeats for the analog input signal 22. As seen in the graphs 202 and 210, moreover, the modulator output data 24 and the data output signal 102 provided by the pulse generation circuit 100 include pulses shown on the left side of FIG. 7 attributed to the modulator output signal 24 based on Sigma Delta modulation operation of the modulator 20 according to the analog input signal 22, and the graph 260 shows the pulse output signal 66 provided from the circuit 10 to the decimation filter 68. As seen, for example, when the input signal 22 is at 0%, no pulses are provided from the modulator 20 and likewise the pulse output signal 66 includes no pulses. Once the analog input signal 22 begins to ramp up, the modulator output signal 24 (graph 202), the data output from the pulser 100 (graph 210) and the pulse output signal 66 (graph 260) are active, including both binary "1's" and "0's" until the input signal 22 reaches 100%, at which the modulator output 24 (graph 202) remains at all "1's". Likewise, the modulator output signal 24 in graph 202 is active (transitioning between "1's" and "0's") while the analog input signal 22 is ramping back down. As shown in graph 240, however, the occurrence of a common mode transient event at 242a (while the enable signal 106 is low) may cause an undesirable transition in the pulse output signal 66. In the illustrated case, the modulator output signal 24 and the data output 102 remain steady (all 1's) at 212 in graph 210, whereas the pulse output signal 66 provides all 0's during the corresponding time T0 at 212 in the graph 260. As such, with the pulse or circuit 100 disabled, the digital output value provided by the decimation filter 68 during the time period T0 incorrectly indicates to an end-user or host system that the analog input 22 is at the lower end of the converter range (e.g., 0%), whereas the actual analog input 22 is at the high end of the range (e.g., 100%). This incorrect data state remains in the illustrated example until the input signal 22 again transitions downward, causing activity in the modulator output signal 24 and the data output 102 from the pulse circuit 100 (graphs 202 and 210 in FIG. 7), which resets the pulse output signal 66 as shown in the graph 260 after the time period T0.

The graph 220 in FIG. 7 illustrates the optional enable signal 106 being asserted after the analog input signal 22 returns to 0% following the first excursion. With the pulser circuit 100 enabled (after the enable signal 106 goes high in FIG. 7), the finite state machine 110 detects that the modulator output data 24 is inactive for a predetermined number of modulator clock cycles (T1 in the graph 230 of FIG. 7) through receipt of the timeout signal 116 shown in graph 230, and accordingly provides the state machine output signal 112 to the logic circuit 117 (FIG. 3) causing the data output stream 102 to include one or more additional pulse edges at 102a in the graph 210 while the analog input signal is at 0%.

Graph 240 in FIG. 7 further shows a signal 242b representing the occurrence of another common mode transient immunity (CMTI) event which inadvertently toggles the pulse output data 66 at 62a in the graph 260, for example by switching the differential output provided by the comparators 52 and 54 of the receiver circuit 50 in FIG. 1. As seen in graphs 210, 230 and 260 of FIG. 7, however, operation of the enabled pulser circuit 100 advantageously generates a subsequent timeout signal 116 and a resulting finite state machine output signal 112 (FIGS. 3 and 5) to introduce an additional pulse edge at 102a in the data output signal 102 (graph 210) which is then transmitted through the isolation circuitry 30, 40 and 50 to reset the pulse output data signal 66 to the correct (binary "0") state (graph 260). Therefore, the pulse generation or reset circuitry 100 of the present disclosure advantageously ensures that the pulse output signal 66 provides an accurate representation of the true condition of the analog input signal 22, even when the isolated modulator circuitry 10 is subjected to common mode transients or other noise.

As further seen in FIG. 7, moreover, enablement of the pulse generation circuitry 100 provides for selective introduction of additional pulse edges when the modulator output signal 24 is inactive with the analog input signal 22 at the maximal (100%) level. During the second illustrated excursion of the analog input signal 22 from 0% to 100% and then back to 0% (on the right-hand side in FIG. 7), the circuitry 100 operates to introduce additional pulse edges at 102b in graph 210 while the input 22 is stable at 100%, based on receipt of timeout signals 230 from the timeout circuit 120 indicating inactivity in the modulator output signal 24 for the predetermined number of modulator clock cycles. As seen in the graph 260, moreover, corresponding pulses are introduced at 62b in the pulse output stream 66. Graph 250 in FIG. 7 illustrates change of the optional select signal 104 during this time period, which operates to change the predetermined number of clock cycles from 125 (128 total including three clock cycles attributed to the finite state machine 110 and the logic circuit 117) to a faster response of 61 cycles (64 total including the three additional clock cycles). As seen in the graph 230 of FIG. 7, therefore, the temporal delay between the timeout signals 116 (and hence the additional pulse edges provided in the data output signal 102 during the time period 102b) is reduced to a shorter time T2 through the selectivity provided by the select signal 104, and a similar changes seen in the pulse output signal 66 in the graph 260.

It will be appreciated that during overload from an extreme input voltage, the use of the appropriate predetermined number of clock cycles for generation of the timeout signal 116, and the synchronization of the pulse generation circuit 100 with the modulator clock signal 96 advantageously provides for receipt of two distinct and repeatable digital values from the resulting filtered output (e.g., from decimation filter 68 in FIG. 1), whereby an end-user or host system will see one predictable value (not all binary "1's") when the analog input signal 22 is at the high end of the conversion range, and a second predictable value (not all binary "0's") when the analog input 22 is at the low end of the conversion range. In the case where the decimation filter 68 is a sinc filter synchronized to the clock signal 86a, one appropriate number of clock cycles for generation of the pulse is a power-of-two value, for example 64 or 128 as shown in the embodiments illustrated above. Furthermore, as seen in FIG. 7 above, the circuitry 100 advantageously monitors the modulator output signal 24 and selectively introduces one or more additional pulse edges into the output data 102 such that any inadvertent (e.g., noise-related) toggling in the receiver circuitry 50 on the low-voltage side of the isolation barrier 40 will be reset to the correct state, thereby ensuring that the actual pulse output data 66 received by the decimation filter 68 will accurately represent the true state of the analog input signal 22. Furthermore, synchronization of the circuit 100 with the modulator clock signal 96 ensures that the expected values for the extreme values of the analog input signal 22 will be repeatable, and the host system or end-user can infer problems with the conversion circuitry (e.g., loss of clock signal from the clock source 86 in FIG. 1) of the extreme maximal or minimal digital data values are received.

Furthermore, the synchronization ensures that any accuracy loss will be stable and predictable. In this regard, selection of the predetermined number of clock cycles can set the circuit response time (e.g., for remediation of any undesired, noise-related output data toggling), where increasing the predetermined number of clock cycles increases the response time, but has a lesser impact on data conversion accuracy and vice versa. However, the operation of the pulse generation circuitry 100 only affects conversion accuracy at the extreme ends of the conversion range (when the modulator 20 is in fact operating outside of its specified input range and the modulator output 24 is therefore inactive), whereby the predetermined number can be designed (or programmatically selected via one or more selection signals 104) to respond relatively quickly to common mode transient events, without any accuracy impact within the normal expected range of the analog input signal 22. In this regard, many analog to digital conversion applications will be designed such that the full (minimal to maximal) range of the converter is not normally used, such that any accuracy errors resulting from the operation of the pulse generation circuitry 100 will not be experienced by an end-user.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An isolated modulator circuit, comprising:
   a modulator providing a modulator output signal based at least partially on an analog input and a modulator clock signal;
   a pulse generation circuit receiving the modulator output signal and being configured to provide a data output signal comprising pulses from the modulator output signal based at least partially on the modulator output signal and the modulator clock signal, the pulse generation circuit being configured to provide at least one additional pulse edge in the data output signal responsive to lack of state changes in the modulator output signal for a predetermined number of clock cycles of the modulator clock signal, the at least one additional pulse edge being synchronized to the modulator clock signal;
   a transmitter circuit receiving the data output signal and being configured to provide a differential transmit output signal at first and second transmit output lines;
   an isolation circuit comprising:
      a first capacitor with a first terminal connected to the first transmit output line and a second terminal connected to a first receiver input line, and
      a second capacitor with a first terminal connected to the second transmit output line and a second terminal connected to a second receiver input line;
   a receiver circuit receiving a receiver differential input signal at the first and second receiver input lines and configured to provide a pulse output signal representing the data output signal based at least partially on the receiver differential input signal.

2. The isolated modulator circuit of claim 1, wherein the pulse generation circuit comprises:
   a finite state machine circuit receiving the modulator output signal, the finite state machine circuit being configured to provide a start signal responsive to each state transition of the modulator output signal, and to provide a state machine output signal responsive to receipt of a timeout signal;
   a timeout circuit receiving the start signal and the modulator clock signal, the timeout circuit being configured to count a number of clock cycles of the modulator clock signal occurring following receipt of the start signal, and to selectively provide the timeout signal to the finite state machine responsive to the number of clock cycles of the modulator clock signal since a most recent start signal reaching the predetermined number; and
   a logic circuit providing the data output signal according to the modulator output signal and the state machine output signal.

3. The isolated modulator circuit of claim 2, wherein the logic circuit comprises:
an exclusive OR gate with a first input receiving the modulator output signal, a second input receiving the state machine output signal, and an output providing a gate output signal having a first state when one but not both of the first and second inputs are at a first state, and
a deglitch circuit receiving the gate output signal and the modulator clock signal, and providing the data output signal based at least partially on the gate output signal.

4. The isolated modulator circuit of claim 2, wherein the timeout circuit comprises a configuration input, and wherein the timeout circuit is configured to set the predetermined number of clock cycles of the modulator clock signal to a selected one of a plurality of values according to a state of a selection signal received at the configuration input.

5. The isolated modulator circuit of claim 4, wherein the finite state machine circuit comprises:
a first logic circuit receiving the modulator output signal, the timeout signal, and a plurality of current state digital signals representing a binary encoding of a current state of the finite state machine circuit, the first logic circuit being configured to provide a plurality of next state digital signals representing a binary encoding of a next state of the finite state machine circuit based on the modulator output signal, the timeout signal, and the current state digital signals;
a flip-flop circuit including first and second flip-flops receiving the next state digital signals and operating according to the modulator clock signal, the flip-flop circuit providing the current state digital signals based on the next state digital signals at each cycle of the modulator clock signal; and
an output logic circuit receiving the current state digital signals from the flip-flop circuit, the output logic circuit configured to provide the start signal to the timeout circuit responsive to each state transition of the current state of the finite state machine circuit represented by the current state digital signals.

6. The isolated modulator circuit of claim 2, wherein the finite state machine circuit comprises:
a first logic circuit receiving the modulator output signal, the timeout signal, and a plurality of current state digital signals representing a binary encoding of a current state of the finite state machine circuit, the first logic circuit being configured to provide a plurality of next state digital signals representing a binary encoding of a next state of the finite state machine circuit based on the modulator output signal, the timeout signal, and the current state digital signals;
a flip-flop circuit including first and second flip-flops receiving the next state digital signals and operating according to the modulator clock signal, the flip-flop circuit providing the current state digital signals based on the next state digital signals at each cycle of the modulator clock signal; and
an output logic circuit receiving the current state digital signals from the flip-flop circuit, the output logic circuit configured to provide the start signal to the timeout circuit responsive to each state transition of the current state of the finite state machine circuit represented by the current state digital signals.

7. The isolated modulator circuit of claim 1, wherein the pulse generation circuit comprises a configuration input, and wherein the pulse generation circuit is configured to set the predetermined number of clock cycles of the modulator clock signal to a selected one of a plurality of values according to a state of a selection signal received at the configuration input.

8. The isolated modulator circuit of claim 1, comprising:
a clock transmitter circuit receiving an input clock signal and being configured to provide a differential clock transmit output signal at first and second clock transmit output lines;
a clock isolation circuit comprising:
a third capacitor with a first terminal connected to the first clock transmit output line and a second terminal connected to a first clock receiver input line, and
a fourth capacitor with a first terminal connected to the second transmit output line and a second terminal connected to a second clock receiver input line;
a clock receiver circuit receiving a clock receiver differential input signal at the first and second clock receiver input lines and configured to provide the modulator clock signal based on the clock receiver differential input signal.

9. The isolated modulator circuit of claim 1, wherein the modulator is a sigma delta modulator.

10. An analog to digital converter, comprising:
a first input receiving an analog input signal;
a second input receiving a clock input signal;
a converter output providing a pulse output signal synchronized to the clock input signal;
a sigma delta modulator, comprising a forward signal path including at least one integrator receiving the analog input signal, a comparator providing a modulator output signal based on comparison of an output of the forward signal path, and a digital to analog converter providing an analog output signal based on a reference voltage as feedback to the forward signal path based on a conversion of the modulator output signal;
a reset circuit configured to generate a data output signal comprising pulses from the modulator output signal and at least one additional pulse edge responsive to lack of state changes in the modulator output signal for a predetermined number of clock cycles of the clock input signal; and
an isolation circuit configured to convey the data output signal through a capacitively-coupled isolation barrier to provide the pulse output signal to the converter output.

11. The analog to digital converter of claim 10, wherein the reset circuit comprises:
a finite state machine circuit providing a start signal synchronized to the clock input signal and responsive to each state transition of the modulator output signal, the finite state machine circuit providing a state machine output signal synchronized to the clock input signal and responsive to receipt of a timeout signal;
a timeout circuit configured to count a number of clock cycles of the clock input signal occurring following receipt of the start signal from the finite state machine circuit, and to selectively provide the timeout signal to the finite state machine responsive to the number of clock cycles of the clock input signal since a most recent start signal reaching the predetermined number; and
a logic circuit with a first input receiving the modulator output signal, a second input receiving the state machine output signal, and an output providing the data output signal having a first state when one but not both of the first and second inputs are at a first state.

12. The analog to digital converter of claim 11, comprising a configuration input receiving a selection signal, wherein the timeout circuit is configured to set the predetermined number of clock cycles of the clock input signal to a selected one of a plurality of values according to a state of the selection signal.

13. The analog to digital converter of claim 12, wherein the isolation circuit is configured to convey the clock input signal through a second capacitively-coupled isolation barrier to provide a modulator clock signal to synchronize the sigma delta modulator and the reset circuit with the clock input signal.

14. The analog-to-digital converter of claim 11, wherein the finite state machine circuit comprises:
- a first logic circuit receiving the modulator output signal, the timeout signal, and a plurality of current state digital signals representing a binary encoding of a current state of the finite state machine circuit, the first logic circuit being configured to provide a plurality of next state digital signals representing a binary encoding of a next state of the finite state machine circuit based on the modulator output signal, the timeout signal, and the current state digital signals;
- a flip-flop circuit including first and second flip-flops configured to provide the current state digital signals based on the next state digital signals at each cycle of the clock input signal; and
- an output logic circuit configured to provide the start signal to the timeout circuit responsive to each state transition of the current state of the finite state machine circuit represented by the current state digital signals.

15. The analog to digital converter of claim 10, comprising a configuration input receiving a selection signal, wherein the reset circuit is configured to set the predetermined number of clock cycles of the clock input signal to a selected one of a plurality of values according to a state of the selection signal.

16. The analog to digital converter of claim 15, wherein the isolation circuit is configured to convey the clock input signal through a second capacitively-coupled isolation barrier to provide a modulator clock signal to synchronize the sigma delta modulator and the reset circuit with the clock input signal.

17. The analog to digital converter of claim 10, wherein the isolation circuit is configured to convey the clock input signal through a second capacitively-coupled isolation barrier to provide a modulator clock signal to synchronize the sigma delta modulator and the reset circuit with the clock input signal.

18. The analog-to-digital converter of claim 17, wherein the isolation circuit comprises a first capacitively-coupled differential isolated signal path for transmission of the data output signal to provide the pulse output signal to the converter output, and a second capacitively-coupled differential isolated signal path for transmission of the clock input signal to provide the modulator clock signal to the sigma delta modulator and to the reset circuit.

19. The analog-to-digital converter of claim 10, wherein the isolation circuit comprises a capacitively-coupled differential isolated signal path for transmission of the data output signal to provide the pulse output signal to the converter output.

20. The analog-to-digital converter of claim 10, comprising a sinc filter synchronized to the clock input signal and receiving the pulse output signal from the isolation circuit to provide a digital output value representing the analog input signal, wherein the predetermined number is a positive power-of-two value.

* * * * *